United States Patent
Ono

(10) Patent No.: US 9,680,088 B2
(45) Date of Patent: Jun. 13, 2017

(54) FERROMAGNETIC TUNNEL JUNCTION ELEMENT AND METHOD OF DRIVING FERROMAGNETIC TUNNEL JUNCTION ELEMENT

(71) Applicant: III Holdings 3, LLC, Wilmington, DE (US)

(72) Inventor: Takuya Ono, Tsukama (JP)

(73) Assignee: III HOLDINGS 3, LLC, Wilmington, DE (US)

( * ) Notice: Subject to any disclaimer, the term of this patent is extended or adjusted under 35 U.S.C. 154(b) by 15 days.

(21) Appl. No.: 14/551,095

(22) Filed: Nov. 24, 2014

(65) Prior Publication Data
US 2015/0200356 A1    Jul. 16, 2015

Related U.S. Application Data

(63) Continuation of application No. 12/673,935, filed as application No. PCT/JP2008/065412 on Aug. 28, 2008, now abandoned.

(30) Foreign Application Priority Data

Mar. 6, 2008    (JP) ................................. 2008-056176

(51) Int. Cl.
G11C 11/02    (2006.01)
G11C 11/56    (2006.01)
(Continued)

(52) U.S. Cl.
CPC .............. *H01L 43/08* (2013.01); *B82Y 25/00* (2013.01); *G11C 11/16* (2013.01); *G11C 11/161* (2013.01);
(Continued)

(58) Field of Classification Search
CPC ... H01L 22/34; H01L 23/48; H01L 23/49827; H01L 23/57; H01L 27/0924;
(Continued)

(56) References Cited

U.S. PATENT DOCUMENTS 5,966,323 A * 10/1999 Chen ..................... G11C 11/161
365/158
6,052,263 A    4/2000 Gill
(Continued)

FOREIGN PATENT DOCUMENTS

JP    11-120758    4/1999
JP    2005109263    4/2005
(Continued)

OTHER PUBLICATIONS

International Search Report issued in related PCT/JP2008/065412, mailed Nov. 25, 2008.
(Continued)

*Primary Examiner* — Mary Wilczewski
*Assistant Examiner* — Tsz Chiu
(74) *Attorney, Agent, or Firm* — McAndrews, Held & Malloy, Ltd.

(57) ABSTRACT

In a tunnel junction element having a ferromagnetic free layer, an insulating layer and a ferromagnetic fixed layer, in order to reduce the current necessary for spin-transfer magnetization reversal operation in the tunnel junction element, the ferromagnetic free layer comprises first and second ferromagnetic layers, a nonmagnetic metal layer is provided between these ferromagnetic layers, the nonmagnetic metal layer is such that magnetic coupling is preserved between the first and second ferromagnetic layers, also such that there is no influence on the crystal growth of the first and second ferromagnetic layers, the first ferromagnetic layer and the second ferromagnetic layer are placed such that the first
(Continued)

ferromagnetic layer is in contact with the insulating layer, and the second ferromagnetic layer has a smaller magnetization than the first ferromagnetic layer.

14 Claims, 4 Drawing Sheets

(51) Int. Cl.
| | | |
|---|---|---|
| G11C 11/15 | (2006.01) | |
| H01L 43/08 | (2006.01) | |
| B82Y 25/00 | (2011.01) | |
| G11C 11/16 | (2006.01) | |
| H01F 10/32 | (2006.01) | |
| H01L 43/02 | (2006.01) | |
| H01L 43/10 | (2006.01) | |
| H01L 27/22 | (2006.01) | |

(52) U.S. Cl.
CPC ..... *H01F 10/3254* (2013.01); *H01F 10/3268* (2013.01); *H01F 10/3295* (2013.01); *H01L 27/222* (2013.01); *H01L 43/02* (2013.01); *H01L 43/10* (2013.01); *H01L 27/228* (2013.01)

(58) Field of Classification Search
CPC ... H01L 27/105; H01L 27/1211; H01L 27/22; H01L 27/24; H01L 27/2436; H01L 27/2472; H01L 29/66007; H01L 29/66984; H01L 45/1253; H01L 27/222; H01L 43/02; H01L 43/10; H01L 27/228; B82Y 25/00; G11C 11/16; H01F 10/3254; H01F 10/3268; H01F 10/3295
USPC .......................................................... 257/432
See application file for complete search history.

(56) References Cited

U.S. PATENT DOCUMENTS

| | | | |
|---|---|---|---|
| 6,153,320 A | 11/2000 | Parkin | |
| 6,347,049 B1 | 2/2002 | Childress et al. | |
| 6,538,859 B1 | 3/2003 | Gill | |
| 6,639,830 B1* | 10/2003 | Heide | G11C 11/16 365/158 |
| 6,707,298 B2 | 3/2004 | Suzuki et al. | |
| 6,838,740 B2* | 1/2005 | Huai | B82Y 25/00 257/295 |
| 6,967,863 B2 | 11/2005 | Huai | |
| 7,019,949 B2* | 3/2006 | Freitag | G11B 5/33 360/324.11 |
| 7,057,865 B1* | 6/2006 | Mao | B82Y 10/00 257/E43.004 |
| 7,274,080 B1* | 9/2007 | Parkin | H01L 29/66984 257/30 |
| 7,432,574 B2* | 10/2008 | Nakamura | B82Y 25/00 257/288 |
| 7,535,069 B2* | 5/2009 | Abraham | G11C 11/16 257/421 |
| 7,576,956 B2* | 8/2009 | Huai | G01R 33/06 360/314 |
| 7,596,015 B2 | 9/2009 | Kitagawa et al. | |
| 7,796,428 B2* | 9/2010 | Redon | G11C 11/5607 365/158 |
| 7,894,248 B2* | 2/2011 | Yu | G11C 11/16 365/158 |
| 7,957,184 B2 | 6/2011 | Yoshikawa et al. | |
| 2001/0009063 A1* | 7/2001 | Saito | B82Y 10/00 29/603.08 |
| 2001/0033466 A1* | 10/2001 | Ooshima | B82Y 10/00 360/324.12 |
| 2002/0048128 A1 | 4/2002 | Kamiguchi et al. | |
| 2002/0145902 A1 | 10/2002 | Kunikiyo et al. | |
| 2002/0163767 A1 | 11/2002 | Terunuma | |
| 2003/0007295 A1 | 1/2003 | Kamijima et al. | |
| 2003/0104249 A1 | 6/2003 | Okuno et al. | |
| 2003/0189788 A1 | 10/2003 | Kamijima | |
| 2003/0197984 A1 | 10/2003 | Inomata et al. | |
| 2004/0001372 A1 | 1/2004 | Higo et al. | |
| 2004/0100855 A1* | 5/2004 | Saito | B82Y 10/00 365/232 |
| 2004/0105305 A1* | 6/2004 | Hayakawa | B82Y 25/00 365/173 |
| 2004/0175596 A1 | 9/2004 | Inomata et al. | |
| 2004/0257865 A1 | 12/2004 | Honjo et al. | |
| 2005/0019724 A1 | 1/2005 | Lawler | |
| 2005/0052794 A1 | 3/2005 | Yoshikawa et al. | |
| 2005/0157544 A1 | 7/2005 | Min et al. | |
| 2005/0185347 A1 | 8/2005 | Inomata et al. | |
| 2005/0219769 A1 | 10/2005 | Shimura et al. | |
| 2006/0003185 A1 | 1/2006 | Parkin | |
| 2006/0056115 A1 | 3/2006 | Djayaprawira et al. | |
| 2007/0063236 A1 | 3/2007 | Huai et al. | |
| 2007/0086121 A1 | 4/2007 | Nagase et al. | |
| 2007/0228501 A1* | 10/2007 | Nakamura | B82Y 25/00 257/421 |
| 2007/0254188 A1* | 11/2007 | Hayakawa | B82Y 25/00 428/811.2 |
| 2007/0297218 A1* | 12/2007 | Abraham | G11C 11/16 365/158 |
| 2008/0247072 A1* | 10/2008 | Nozieres | G11C 11/16 360/59 |
| 2008/0272448 A1* | 11/2008 | Dahmani | B82Y 10/00 257/421 |
| 2009/0015958 A1* | 1/2009 | Nakamura | G11B 5/66 360/55 |

FOREIGN PATENT DOCUMENTS

| | | |
|---|---|---|
| JP | 2006080116 | 3/2006 |
| JP | 2006-319259 | 11/2006 |
| JP | 2007-059879 | 3/2007 |
| JP | 2008034857 | 2/2008 |
| WO | 2006071724 | 7/2006 |

OTHER PUBLICATIONS

Sun, J.Z. "Spin-current interaction with a monodomain magnetic body: A model study," Physical Review B, vol. 62, No. 1, pp. 570-578, American Physical Society, 2000, Cited in spec.

* cited by examiner

FERROMAGNETIC TUNNEL JUNCTION ELEMENT AND METHOD OF DRIVING FERROMAGNETIC TUNNEL JUNCTION ELEMENT

TECHNICAL FIELD

This invention relates to a ferromagnetic tunnel junction (MTJ) element serving as a storage element used in magnetic random access memory (MRAM), to a memory device using such an element, and to a method of driving a ferromagnetic tunnel junction element, and in particular relates to an MTJ element with the improved write characteristics.

BACKGROUND ART

Magnetic random access memory (MRAM) is memory using an MTJ element 1, the basic configuration of which is a layered structure of a ferromagnetic free layer 2/insulating layer 3/ferromagnetic fixed layer 4, as shown in FIG. 2. In an MTJ element 1, a phenomenon (the tunnel magnetoresistance or TMR effect) is observed in which the resistance value for tunnel current flowing in the perpendicular direction between layers is different according to whether the direction of the magnetizations of the set of the ferromagnetic free layer 2 and the ferromagnetic fixed layer 4 are parallel or antiparallel. Thus by applying this phenomenon, binary data, recorded as two states which are parallel and antiparallel sets of magnetization directions, can be read out. Moreover, the magnetization directions recorded in the respective ferromagnetic members of the ferromagnetic free layer 2 and the ferromagnetic fixed layer 4 are retained even when the current is turned off. MRAM applies these readout operations and storage/retention operations to nonvolatile memory. Throughout the Specification of this application, descriptions of layers and materials separated by a slash (/) indicate that the layers and materials are arranged in the order of the description.

As the electrical configuration of the memory cell array in an MRAM, generally a configuration is employed in which MTJ elements 1 are positioned at the intersections of bit lines 5 and write word lines 6 arranged in the form of a perpendicular matrix. Here, each MTJ element 1 is combined with a MOS transistor used as switching elements for cell switching to form one bit cell.

One writing method used in such MRAM entails passing current in both a bit line 5 and a write word line 6, applying the magnetic field induced by both the bit line 5 and the write word line 6 to the vicinity of the point of intersection, and causing reversal of the magnetization in the ferromagnetic free layer 2 by means of this magnetic field (hereafter this is called the "magnetic field writing method"). A circuit configuration for such addressing of MTJ elements is shown in FIG. 3. Here, a strong magnetic field is not obtained either from bit line 5 alone or from write word line 6 alone, and a magnetic field equal to or greater than the magnitude of the magnetic field necessary to reverse the ferromagnetic free layer 2 (the switching magnetic field) is not obtained; but at the position of intersection of both lines, at which the magnetic field created by the bit line 5 and the magnetic field created by the write word line 6 are both applied, a magnetic field equal to or greater than the switching magnetic field can be obtained, and so writing can be performed by selecting the bit line 5 connected to the desired bit cell and passing current, and also passing current through the write word line 6. In a readout operation of this method, first the desired bit line 5 and read word line 7 are selected. Then, by means of current flowing from the selected bit line 5, through the MTJ element 1, via the route to the readout electrode 8 and selected read word line 7, the voltage value occurring at the MTJ element 1 (that is, the resistance value of the MTJ element 1) is detected. Further, the state of the set of magnetizations at the MTJ element connected to the selected bit line 5 and read word line 7 is identified. By means of this processing, a readout operation is performed. Here, the intermediate value between the detected voltages for the case in which the magnetization directions are parallel and the case in which the directions are antiparallel in the MTJ element 1 is set as a reference voltage, and by means of the detected voltage or resistance value, it is possible to identify either a "1" or a "0" as having been allocated to the combination of magnetization directions of the ferromagnetic free layer 2 and ferromagnetic fixed layer 4 of the MTJ element 1.

However, when MRAM is manufactured with a high level of integration using MTJ elements configured so as to use the magnetic field writing method, as elements are made smaller, the switching magnetic field of the ferromagnetic free layer 2 increases, while the current passed through bit lines 5 and write word lines 6 decreases. Hence the problem arises that causing reversal of the magnetization of the ferromagnetic free layer 2, that is, writing data, becomes difficult, and this constitutes a major engineering issue for MRAMs.

As one means to resolve this, in place of the magnetic field writing method, MTJ elements utilizing technology in place of the magnetic field writing method in which spin-polarized current is passed spanning the ferromagnetic free layer and the ferromagnetic fixed layer to cause reversal of the magnetization of the ferromagnetic free layer (called "spin-transfer magnetization reversal"), as well as MRAMs using such elements, have been developed. FIG. 4 shows the configuration of MRAM utilizing spin-transfer magnetization reversal; this configuration is proposed in Patent Reference 2 and elsewhere.

When spin-transfer magnetization reversal is used, writing is performed as follows. First, the passing of a current so as to inject electrons from the ferromagnetic fixed layer 4 into the ferromagnetic free layer 2 is considered. The spin of electrons passing through the ferromagnetic fixed layer 4 is polarized in the magnetization direction of the ferromagnetic fixed layer 4 by the action of spin-torque from the magnetization of the ferromagnetic fixed layer 4 resulting from the exchange interaction with the magnetization, that is, the electrons are spin-polarized. When spin-polarized electrons enter the ferromagnetic free layer 2, they then impart a spin-torque to the magnetization of the ferromagnetic free layer 2. In this way, the magnetization of the ferromagnetic free layer 2 is arranged to be parallel to the magnetization of the ferromagnetic fixed layer 4. Conversely, when a current is passed such that electrons are injected from the ferromagnetic free layer 2 into the ferromagnetic fixed layer 4, electrons have spin antiparallel to the ferromagnetic fixed layer 4 are reflected at the interface between the ferromagnetic fixed layer 4 and the insulating layer 3, and the reflected electrons impart a spin-torque to the magnetization of the ferromagnetic free layer 2. As a result, the magnetization of the ferromagnetic free layer 2 becomes antiparallel to the magnetization of the ferromagnetic fixed layer 4. Based on the above principle, by selecting the direction of current applied to the multilayer film, the magnetizations of the ferromagnetic fixed layer 4 and ferromagnetic free layer 2 can be made parallel or antiparallel. This is the spin-transfer magnetization reversal technique.

In order to perform actual write operations using the spin-transfer magnetization reversal technique, a current larger than the current value necessary to perform magnetization reversal in the ferromagnetic free layer 2 by means of a current (the critical current) is necessary. During readout, a current smaller than the critical current is passed, and similarly to conventional MRAMs, the resistance value or voltage value is detected and data readout performed. In addition to the advantage of enabling writing even when integration levels are raised, MRAM utilizing the spin-transfer magnetization technique has the further advantage that, compared with conventional MRAM, write word lines to generate a write magnetic field are unnecessary, so that the element structure can be simplified.

Patent Reference 1: Japanese Patent Application Laid-open No. 2006-80116
Patent Reference 2: Japanese Patent Application Laid-open No. H11-120758
Non-patent Reference 1: J. Z. Sun, "Spin-current interaction with a monodomain magnetic body: A model study", Physical Review B, volume 62, number 1, page 570, American Physical Society, 2000

However in MRAM which adopts the magnetic field writing method, and even in MRAM which adopts the spin-transfer magnetization reversal technique (spin-transfer magnetization reversal MRAM), there is the problem that the current necessary for writing is too large. Specifically, the critical current density necessary for magnetization reversal in spin-transfer magnetization reversal MRAM is still $10^6$ A/cm$^2$ or higher, and it is necessary to develop technology such that the critical current density is at the practical level of $10^5$ A/cm$^2$. In magnetic field writing MRAM as well, reduction of the current value necessary for writing is a common problem.

This invention was devised in order to resolve at least one of these problems.

DISCLOSURE OF THE INVENTION

In order to resolve the above problems, in this invention a ferromagnetic tunnel junction element, memory using such an element, and a method of driving a ferromagnetic tunnel junction element are provided. That is, in this invention, a ferromagnetic tunnel junction element is provided comprising a ferromagnetic free layer, an insulating layer, and a ferromagnetic fixed layer which together with the ferromagnetic free layer sandwiches the insulating layer; the ferromagnetic free layer comprises a first ferromagnetic layer in contact with the insulating layer, a nonmagnetic metal layer, and a second ferromagnetic layer which together with the first ferromagnetic layer sandwiches the nonmagnetic metal layer and which has a saturation magnetization smaller than the saturation magnetization of the first ferromagnetic layer; the film thickness of the nonmagnetic metal layer is set to a film thickness at which the magnetic coupling between the first ferromagnetic layer and the second ferromagnetic layer is ferromagnetic coupling; and the magnetization direction of the first ferromagnetic layer is determined according to the magnetization direction of the second ferromagnetic layer.

When such a ferromagnetic tunnel junction element is used as a storage element in a memory device which performs recording by means of the magnetization direction of the ferromagnetic free layer by passing current between the ferromagnetic free layer and the ferromagnetic fixed layer, by using a current of magnitude sufficient to cause reversal of the magnetization of the second ferromagnetic layer, the magnetization of the first ferromagnetic layer, the magnetization direction of which is determined according to the magnetization of the second ferromagnetic layer, can also be controlled. Here, the ferromagnetic fixed layer may have a single-layer structure (a continuous-layer structure with a single composition), or may have a multilayer structure comprising a plurality of layers. In the case of a multilayer structure, the ferromagnetic fixed layer can comprise a ferromagnetic layer in at least one of the layers. Throughout this specification, a ferromagnetic layer includes both a layer comprising a hard magnetic material, and a layer comprising a soft magnetic material.

Here, for coupling between the first and second ferromagnetic layers to be ferromagnetic coupling means that an important role in reversal operation is played. This point is discussed in detail in the practical example described below.

Further, in this invention it is preferable, in the above-described ferromagnetic tunnel junction element, for the first ferromagnetic layer to comprise any one among a single metal selected from the magnetic metal group consisting of iron, cobalt and nickel, or an alloy comprising one metal selected from the magnetic metal group, or a compound comprising one metal selected from the magnetic metal group and a metalloid element, and for the insulating layer to comprise single-crystal or fine crystals of magnesium oxide. When the first ferromagnetic layer comprises any of the materials described above, a high TMR ratio can be obtained.

In this invention, it is preferable, in the above-described ferromagnetic tunnel junction element, that the insulating layer and the first ferromagnetic layer be epitaxially joined with each other, and that the material of the nonmagnetic metal layer be selected from materials which prevent mutual influence of the crystallinity of the first and second ferromagnetic layers. Here, "epitaxially joined" means that the crystals of each of the layers have a crystal structure which is influenced by the arrangement of the crystal lattice in the other layer. Such a junction is not limited to a case of epitaxial growth of one film on the other film. Moreover, to "prevent mutual effects of crystallinity" generally means the ability to prevent effects accompanying crystal mismatching arising when two films of materials with different crystal structures and lattice constants are in mutual contact; as a representative example, two layers which are difficult to bring into contact in layers can be deposited by positioning a layer of a nonmagnetic metal therebetween. In addition, there is also the ability to avoid the occurrence over time of the influence of one crystal structure on the other crystal structure after film deposition when direct contact is made. Selection of a nonmagnetic material for these purposes includes selection of a material which is, with respect to the crystal structures and lattice constants of the crystals of the two layers, a crystal with intermediate properties; selection of a material which is, with respect to the crystal structures and lattice constants of the crystals of the two layers, a crystal with different properties; use of an amorphous metal which is a metal but does not form a crystal; and similar.

In this invention, it is preferable, in the above-described ferromagnetic tunnel junction element, that the second ferromagnetic layer be of Permalloy. By using Permalloy, a soft magnetic material with high magnetic permeability, when the first ferromagnetic layer of the invention is for example a material having a large spontaneous magnetization, magnetization in the same direction occurs via the nonmagnetic layer, and a state having a smaller saturation magnetization than in the first ferromagnetic layer can be induced, which is preferable.

In this invention, it is preferable that the above-described ferromagnetic tunnel junction element be comprised by magnetic random access memory as a storage element. Magnetic random access memory enabling writing with a low current density has the advantage of reduced heat dissipation in addition to reducing power consumption. Further, it is preferable that the second ferromagnetic layer be of Permalloy. By using Permalloy, a soft magnetic material with high magnetic permeability, when the first ferromagnetic layer of the invention is for example a material having a large spontaneous magnetization, magnetization in the same direction occurs via the nonmagnetic layer, and a state having a smaller saturation magnetization than in the first ferromagnetic layer can be induced, which is preferable.

In this invention, a method of driving a ferromagnetic tunnel junction element described above is provided. That is, a method is provided for driving a ferromagnetic tunnel junction element, comprising a ferromagnetic free layer, an insulating layer, and a ferromagnetic fixed layer which together with the ferromagnetic free layer sandwiches the insulating layer, and in which the ferromagnetic free layer comprises a first ferromagnetic layer, a nonmagnetic metal layer, and a second ferromagnetic layer which together with the first ferromagnetic layer sandwiches the nonmagnetic metal layer, the second ferromagnetic layer has a saturation magnetization smaller than the saturation magnetization of the first ferromagnetic layer, and the film thickness of the nonmagnetic metal layer is set to a film thickness at which the magnetic coupling between the first ferromagnetic layer and the second ferromagnetic layer is ferromagnetic coupling; the method comprises a step of passing a current, which is a current to cause reversal of the magnetization of the second ferromagnetic layer, from one of the layers comprised by the ferromagnetic free layer to the ferromagnetic fixed layer, or from the ferromagnetic fixed layer to one of the layers comprised by the ferromagnetic free layer, and a step of then causing reversal of the magnetization direction of the first ferromagnetic layer according to reversal of the magnetization of the second ferromagnetic layer, and halting the passage of the current.

By means of this invention, an MTJ element with a small current value required for writing can be realized, and MRAM with low power consumption can be configured.

EXPLANATION OF REFERENCE NUMERALS

Figure 1:
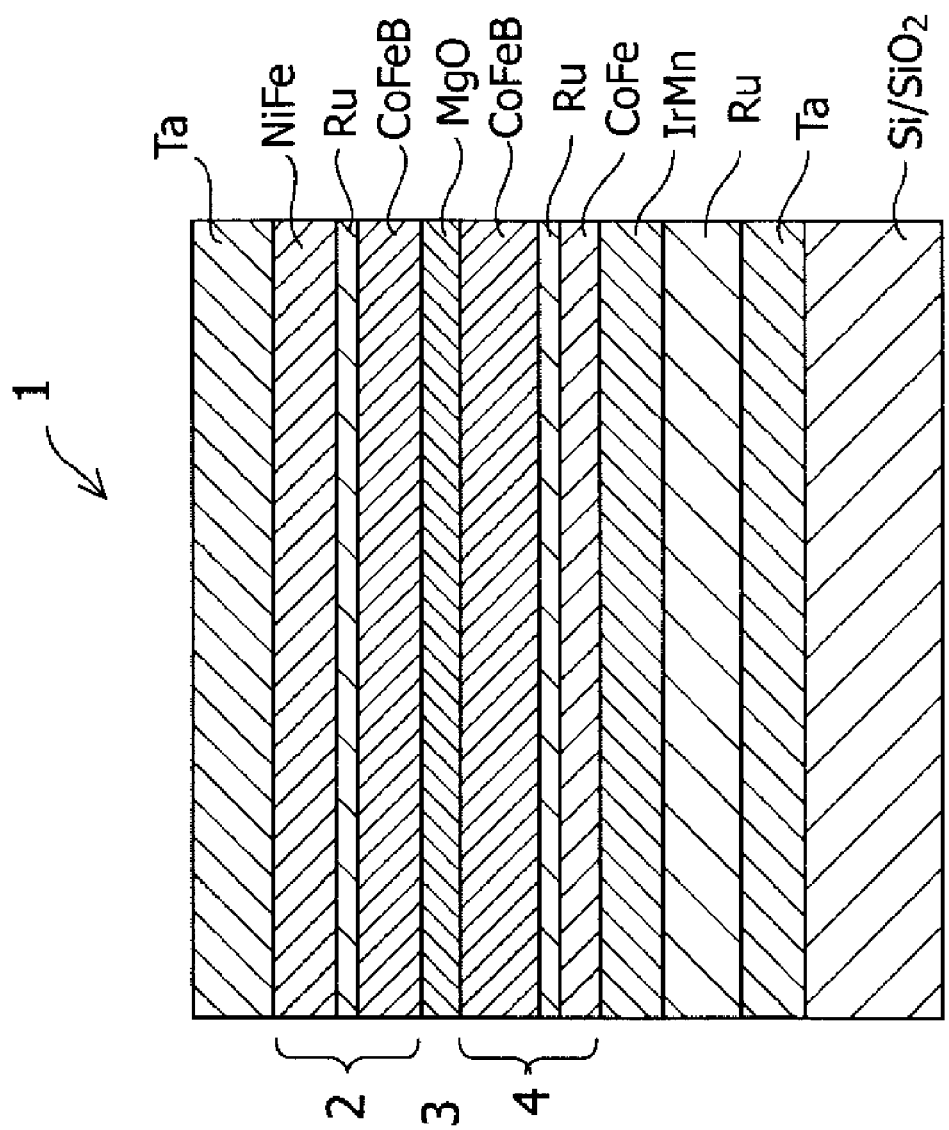
FIG. 1 is a cross-sectional view of an MTJ element in Practical Example 1.
Figure 2:
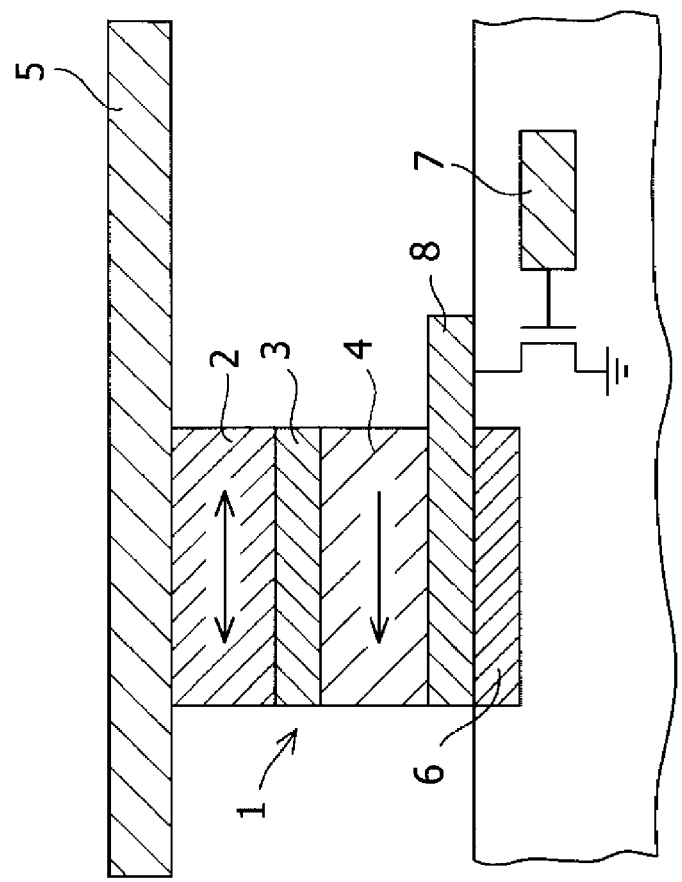
FIG. 2 explains the configuration of an MTJ element used in MRAM, in a magnetic field writing method of the prior art.
Figure 3:
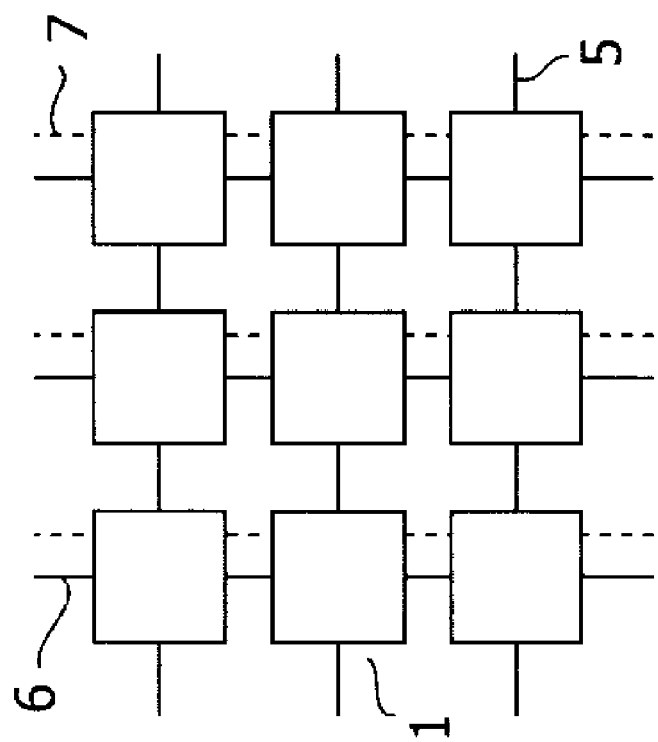
FIG. 3 explains a circuit configuration for addressing MTJ elements of MRAM, in a magnetic field writing method of the prior art.
Figure 4:
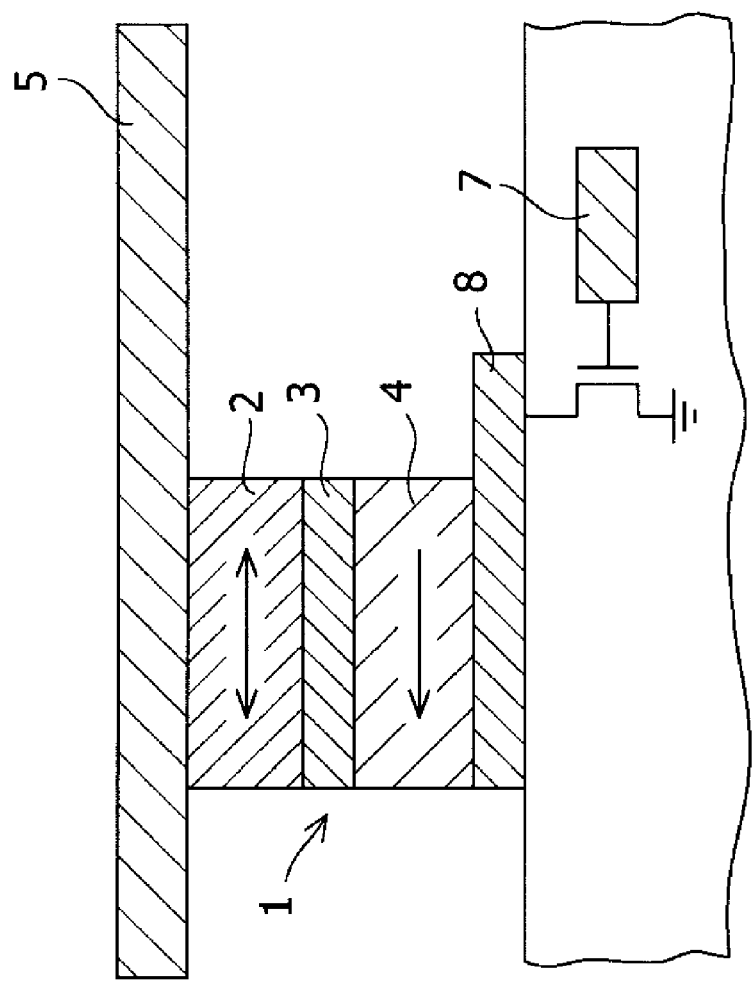
FIG. 4 explains a configuration of MRAM using the spin-transfer magnetization reversal technique in the prior art.

1 Ferromagnetic tunnel junction (MTJ) element
2 Ferromagnetic free layer
3 Insulating layer 4 Ferromagnetic fixed layer
5 Bit line
6 Write word line
7 Read word line
8 Readout electrode

BEST MODE FOR CARRYING OUT THE INVENTION

Below, an embodiment of the invention is explained, referring to the drawings. The invention of this application is limited only by the attached Scope of Claims, and descriptions in embodiments and practical examples below are used solely as examples to aid understanding of the Scope of Claims.

Practical Example 1

This practical example is an MTJ element 1, which is an MTJ element of the invention in which $Ni_{80}Fe_{20}$ (Permalloy) is adopted as the low-magnetization ferromagnetic layer (second ferromagnetic layer). FIG. 1 shows the cross-sectional configuration of the MTJ element 1 of this practical example; below, a method of fabrication of the MTJ element of this practical example is described. As shown in the figure, the MTJ element 1 of this practical example has a configuration in which are layered, in order, $Si/SiO_2/Ta$ (5 nm)/Ru (10 nm)/$Ir_{25}Mn_{75}$ (10 nm)/$Co_{70}Fe_{30}$ (3 nm)/Ru (0.8 nm)/$Co_{40}Fe_{40}B_{20}$ (3 nm)/MgO (2 nm)/$Co_{60}Fe_{20}B_{20}$ (3 nm)/Ru (1.4 nm)/$Ni_{80}Fe_{20}$ (3 nm)/Ta (10 nm). Of these, $Si/SiO_2$ means a thermally oxidized Si substrate (Si wafer). The IrMn layer is a layer to apply an antiferromagnetic exchange bias to the ferromagnetic fixed layer 4 (CoFe ferromagnetic layer/Ru intermediate layer/CoFeB ferromagnetic layer), and acts to fix the magnetization direction of the ferromagnetic fixed layer 4. The ferromagnetic fixed layer 4 has a CoFe ferromagnetic layer/Ru intermediate layer/CoFeB ferromagnetic layer multilayer ferrimagnetic structure. The ferromagnetic free layer 2, comprising a CoFeB ferromagnetic layer/Rn intermediate layer/NiFe ferromagnetic layer multilayer ferrimagnetic structure, is positioned enclosing the MgO insulating layer, which is the insulating layer 3. The configuration of the ferromagnetic free layer 2 is described below.

A magnetron sputtering apparatus was used in deposition of the above-described multilayer structure. The background pressure must be $3 \times 10^{-7}$ Pa or lower. Films other than MgO, that is, metal films, were deposited using DC magnetron sputtering in an Ar gas atmosphere. On the other hand, MgO film deposition was performed by RF magnetron sputtering in an Ar gas atmosphere from a sintered MgO target.

After deposition of the multilayer film, patterning processes using photolithography and electron beam lithography, and argon ion milling processes, are used to fabricate the MTJ element 1. In this practical example, a milling process employing argon ions was used to expose the MTJ element 1. Then, the MTJ element 1 is subjected to thermal annealing in a vacuum chamber while maintaining a state in which a magnetic field was applied. In this practical example, the heating temperature when performing the annealing was 400° C., the heating time is 2 hours, the magnetic field strength is 4 kOe, and the vacuum is approximately $10^{-4}$ Pa. By means of an annealing process after film deposition, the CoFeB film (first ferromagnetic layer) which had been amorphous immediately after film deposition is crystallized with the bcc (body-centered cubic) structure, with the single-crystal MgO as a seed. At this time, the NiFe film (second ferromagnetic layer) has the fcc (face-centered cubic) structure, but because the Ru layer is interposed, the difference in the crystal structures of the CoFeB film (first ferromagnetic layer) and the NiFe film (second ferromagnetic layer) does not affect crystallization of the CoFeB layer.

According to Non-patent Reference 1, the current value necessary for spin-transfer magnetization reversal is proportional to $Hk \times Ms \times (Hk+2\pi Ms)$. Here Hk is the anisotropy magnetic field of the ferromagnetic free layer 2, and Ms is the saturation magnetization. From this, by lowering the anisotropy magnetic field Hk of the ferromagnetic free layer 2 and the saturation magnetization Ms, writing to the ferromagnetic free layer 2 (reversal of the magnetization of the ferromagnetic free layer 2) is made easier. The effect of lowering the saturation magnetization Ms is particularly great. However, lowering the saturation magnetization Ms of CoFeB is difficult. This is because in order to lower the saturation magnetization Ms of CoFeB, the annealing temperature must be lowered and impurity doping must be performed, and these changes in conditions induce worsening of the crystallinity of CoFeB. And, reduced crystallinity leads to a lower TMR ratio and reduced thermal stability. That is, if CoFeB is deposited under conditions which lower the saturation magnetization, an adequate TMR ratio and thermal stability cannot be secured.

Hence in this practical example, a Ru layer is placed between the CoFeB and the NiFe, while layering NiFe, which is a ferromagnetic layer (low-magnetization ferromagnetic layer, second ferromagnetic layer) with low magnetization, in proximity to the CoFeB layer (first ferromagnetic layer), for the purpose of achieving reduced effective saturation magnetization of the ferromagnetic free layer. Here the Ru layer is placed therebetween in order to preserve the crystallinity of the CoFeB. That is, the Ru layer separates the crystal growth of the two layers which are the CoFeB layer and the NiFe layer, that is, acts so as to cause crystallization in a state in which the crystal structure of the CoFeB layer and the crystal structure of the NiFe layer do not exert mutual influence, as well as to cause magnetic coupling between the layers through the RKKY interaction. In this practical example, the Ru film thickness is set to 0.4 nm so that the RKKY interaction acts ferromagnetically, that is, such that the parallel state of the magnetizations of the CoFeB layer and NiFe layer is preserved. Whether a parallel state or an antiparallel state is preserved between two magnetic layers interacting through the RKKY interaction generally depends on the film thickness of the nonmagnetic metal layer placed between the magnetic layers.

Below, advantageous results of this practical example are described, for a case in which the combination of magnetizations of the ferromagnetic fixed layer and the ferromagnetic free layer are changed from a parallel state into an antiparallel state by passing a magnetization reversal current. Spin-polarized electrons flowing from the ferromagnetic fixed layer retain to some degree the spin polarization in the 3 nm CoFeB ferromagnetic layer, and arrive at the NiFe layer. Because of the low saturation magnetization of the NiFe layer, magnetization reversal occurs at a lower current density than for the CoFeB layer. Because the NiFe layer and the CoFeB layer are ferromagnetically coupled by means of the RKKY interaction via the Ru, that is, are magnetically coupled so as to be mutually parallel, magnetization reversal in the NiFe layer is accompanied by magnetization reversal in the CoFeB layer as well, and consequently magnetization reversal is realized at a lower current density than for a CoFeB single-layer ferromagnetic free layer. Here, it is important that the film thickness of the Ru layer be determined such that the NiFe layer and the CoFeB layer are ferromagnetically coupled. This is because if the coupling is antiferromagnetic, the magnetizations of the NiFe layer and of the ferromagnetic fixed layer are in a parallel state, so that spin-polarized electrons arriving at the NiFe layer act in the direction to fix the magnetization of the NiFe layer, and magnetization reversal of the ferromagnetic free layer becomes more difficult, rather than easier. Likewise in a case where, in a state in which the ferromagnetic fixed layer and the ferromagnetic free layer are parallel, a magnetization reversal current is passed to change to the antiparallel state, similar advantageous results are obtained for spin-polarized electrons reflected at the ferromagnetic fixed layer interface, so that by means of this practical example there is the advantageous result of a lowered magnetization reversal current.

In the above, an embodiment of the invention has been described; however, the invention is not limited to the above-described embodiment, and various modifications, alternations, and combinations are possible based on the technical concept of the invention.

The invention claimed is:

1. A ferromagnetic tunnel junction element, comprising:
   a ferromagnetic free layer;
   an insulating layer; and
   a ferromagnetic fixed layer that, together with the ferromagnetic free layer, sandwiches the insulating layer;
   wherein the ferromagnetic free layer includes a first ferromagnetic layer in contact with the insulating layer, a nonmagnetic metal layer, and a second ferromagnetic layer that, together with the first ferromagnetic layer, sandwiches the nonmagnetic metal layer, and wherein the second ferromagnetic layer has a saturation magnetization smaller than a saturation magnetization of the first ferromagnetic layer; and
   wherein a film thickness of the nonmagnetic metal layer is set to a film thickness at which the first ferromagnetic layer is ferromagnetically coupled to the second ferromagnetic layer to maintain a parallel state between the first ferromagnetic layer and the second ferromagnetic layer in which a magnetization direction of the first ferromagnetic layer is parallel with and in a same direction as a magnetization direction of the second ferromagnetic layer.

2. The ferromagnetic tunnel junction element of claim 1, wherein:
   the first ferromagnetic layer comprises:
   a single metal selected from a magnetic metal group consisting of iron, cobalt, and nickel; or
   an alloy comprising one metal selected from the magnetic metal group; or
   a compound comprising one metal selected from the magnetic metal group and a metalloid element; and
   the insulating layer comprises magnesium oxide.

3. The ferromagnetic tunnel junction element of claim 1, wherein the insulating layer and the first ferromagnetic layer are epitaxially joined with each other, and wherein the nonmagnetic metal layer is selected from materials which prevent mutual influence of crystallinity of the first and second ferromagnetic layers.

4. The ferromagnetic tunnel junction element of claim 1, wherein the second ferromagnetic layer is of Permalloy.

5. A magnetic random access memory, comprising:
   a plurality of storage elements, each storage element including a ferromagnetic tunnel junction element comprising a ferromagnetic free layer, an insulating layer, and a ferromagnetic fixed layer that, together with the ferromagnetic free layer, sandwiches the insulating layer;

wherein the ferromagnetic free layer includes a first ferromagnetic layer in contact with the insulating layer, a nonmagnetic metal layer, and a second ferromagnetic layer that, together with the first ferromagnetic layer, sandwiches the nonmagnetic metal layer, and wherein the second ferromagnetic layer has a saturation magnetization smaller than a saturation magnetization of the first ferromagnetic layer; and wherein a film thickness of the nonmagnetic metal layer is set to a film thickness at which the first ferromagnetic layer is ferromagnetically coupled to the second ferromagnetic layer to maintain a parallel state between the first ferromagnetic layer and the second ferromagnetic layer in which a magnetization direction of the first ferromagnetic layer is parallel with and in a same direction as a magnetization direction of the second ferromagnetic layer.

6. The magnetic random access memory of claim 5, wherein the second ferromagnetic layer of each storage element is of Permalloy.

7. A ferromagnetic tunnel junction element, comprising:
a ferromagnetic free layer;
an insulating layer; and
a ferromagnetic fixed layer that, together with the ferromagnetic free layer, sandwiches the insulating layer;
wherein the ferromagnetic free layer includes a first ferromagnetic layer and a second ferromagnetic layer;
wherein the first ferromagnetic layer is in contact with the insulating layer and ferromagnetically coupled to the second ferromagnetic layer;
wherein the first ferromagnetic layer and the second ferromagnetic layer have a same direction of magnetization with respect to each other; and
wherein the second ferromagnetic layer has a saturation magnetization smaller than a saturation magnetization of the first ferromagnetic layer to obtain an effective saturation magnetization for the ferromagnetic free layer that is smaller than the saturation magnetization of the first ferromagnetic layer.

8. The ferromagnetic tunnel junction element of claim 7, wherein:
the first ferromagnetic layer comprises:
a single metal selected from a magnetic metal group consisting of iron, cobalt, and nickel; or
an alloy comprising one metal selected from the magnetic metal group; or
a compound comprising one metal selected from the magnetic metal group and a metalloid element; and
the insulating layer comprises magnesium oxide.

9. The ferromagnetic tunnel junction element of claim 7, wherein the insulating layer and the first ferromagnetic layer are epitaxially joined with each other, and wherein the nonmagnetic metal layer is selected from materials which prevent mutual influence of crystallinity of the first and second ferromagnetic layers.

10. The ferromagnetic tunnel junction element of claim 7, wherein the second ferromagnetic layer is of Permalloy.

11. A magnetic random access memory, comprising:
a plurality of bit lines;
a plurality of read word lines; and
a plurality of ferromagnetic tunnel junction elements;
wherein each ferromagnetic tunnel junction element is associated with a bit line of the plurality of bit lines and a read word line of the plurality of read word lines and includes a ferromagnetic fixed layer and a ferromagnetic free layer;
wherein the ferromagnetic fixed layer has a fixed magnetization direction;
wherein an associated bit line is configured to align a magnetization direction of the ferromagnetic free layer with the fixed magnetization direction to store a first bit value and reverse the magnetization direction with respect to the fixed magnetization direction to store a second bit value;
wherein the ferromagnetic free layer comprises a first ferromagnetic layer ferromagnetically coupled to a second ferromagnetic layer;
wherein magnetization of the first ferromagnetic layer and magnetization of the second ferromagnetic layer are directed in a common direction with each other; and
wherein the second ferromagnetic layer has a saturation magnetization smaller than a saturation magnetization of the first ferromagnetic layer to obtain an effective saturation magnetization for the ferromagnetic free layer that is smaller than the saturation magnetization of the first ferromagnetic layer.

12. The magnetic random access memory of claim 11, wherein:
the first ferromagnetic layer of each ferromagnetic tunnel junction element comprises:
a single metal selected from a magnetic metal group consisting of iron, cobalt, and nickel; or
an alloy comprising one metal selected from the magnetic metal group; or
a compound comprising one metal selected from the magnetic metal group and a metalloid element; and
the insulating layer of each ferromagnetic tunnel junction comprises magnesium oxide.

13. The magnetic random access memory of claim 12, wherein the insulating layer and the first ferromagnetic layer of each ferromagnetic tunnel junction element are epitaxially joined with each other, and wherein the nonmagnetic metal layer is selected from materials which prevent mutual influence of crystallinity of the first and second ferromagnetic layers of each ferromagnetic tunnel junction element.

14. The magnetic random access memory of claim 12, wherein the second ferromagnetic layer of each ferromagnetic tunnel junction element comprises Permalloy.

* * * * *